United States Patent
Seyama

(10) Patent No.: US 7,780,056 B2
(45) Date of Patent: Aug. 24, 2010

(54) HORN ATTACHMENT ARM

(75) Inventor: Kohei Seyama, Fussa (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 12/072,380

(22) Filed: Feb. 26, 2008

(65) Prior Publication Data

US 2008/0203136 A1  Aug. 28, 2008

(30) Foreign Application Priority Data

Feb. 28, 2007  (JP)  ............................. 2007-050218

(51) Int. Cl.
*B23K 37/00* (2006.01)
(52) U.S. Cl. ........................ 228/1.1; 228/4.5; 228/110.1
(58) Field of Classification Search .............. 228/110.1, 228/102, 1.1, 4.5, 180.5, 904; 156/580.1, 156/580.2
See application file for complete search history.

(56) References Cited

U.S. PATENT DOCUMENTS

| | | | | |
|---|---|---|---|---|
| 5,893,509 | A * | 4/1999 | Pasquier | 228/4.5 |
| 6,923,361 | B2 * | 8/2005 | Maeda | 228/1.1 |
| 7,353,976 | B2 * | 4/2008 | Melzer | 228/4.5 |
| 2003/0076661 | A1 * | 4/2003 | Murata et al. | 361/760 |
| 2003/0111513 | A1 * | 6/2003 | Ehlert et al. | 228/110.1 |
| 2004/0245314 | A1 * | 12/2004 | Vischer | 228/4.5 |
| 2006/0283911 | A1 * | 12/2006 | Frasch et al. | 228/4.5 |

FOREIGN PATENT DOCUMENTS

| | | |
|---|---|---|
| JP | 05-082577 | 4/1993 |
| JP | 2000-164624 | 6/2000 |
| JP | 2000-332050 | 11/2000 |
| JP | 2003-258021 | 9/2003 |

* cited by examiner

*Primary Examiner*—Jessica L Ward
*Assistant Examiner*—Nicholas P D'Aniello
(74) *Attorney, Agent, or Firm*—William L. Androlia; H. Henry Koda

(57) ABSTRACT

A horn attachment arm for a bonding apparatus that performs high speed bonding with high accuracy to a large sized workpiece is provided. The horn attachment arm includes a fixing bracket fixed to a moveable member of a driving motor and a ultrasonic horn attaching bracket for attaching an ultrasonic horn on a tip end side to be fixed by being sandwiched between flat plates made of carbon fiber reinforced plastic. A flat plate space keeping member is attached between the flat plates so as to extend between the brackets. Flanges of the brackets and the longitudinal structure member are fixed to respective flat plates using a screw and an adhesive agent. The carbon fiber reinforced plastic that constitutes the flat plates has a greater number of reinforced fibers in a longitudinal direction than in a width direction, and is high in strength and rigidity in the longitudinal direction.

6 Claims, 5 Drawing Sheets

HORN ATTACHMENT ARM

BACKGROUND OF THE INVENTION

The present invention relates to horn attachment arms for bonding apparatuses.

A semiconductor manufacturing process includes various steps such as die bonding with which a semiconductor die is mounted to a circuit board, and wire bonding with which an electrode of the semiconductor die mounted to the circuit board by the die bonding is connected to an electrode of the circuit board with a wire. In such die bonding and wire bonding, a die bonding apparatus and a wire bonding apparatus are used respectively. Such an apparatus is each provided with a bonding tool such as a collet that pressure-bonds the semiconductor die to the circuit board or a capillary that pressure-bonds the connection wire threaded there threw to the respective electrodes. The bonding tool is attached to a tip end of an ultrasonic horn. The tip end is driven up and down by a driving motor, and an ultrasonic transducer that vibrates the bonding tool when bonding is attached to a rear end of the ultrasonic horn.

As an example, Japanese Patent Application Unexamined Publication Disclosure No. H05-82577 proposes a structure of a wire bonding apparatus in which an ultrasonic horn attached with a capillary at its tip end is supported rotatably about a rotating shaft along with a yoke of a driving motor, and vibrating the yoke of the driving motor causes the ultrasonic horn to rotate about the rotating shaft in forward and backward directions, thereby driving the tip end of the ultrasonic horn in a Z direction, which is an upward-downward direction.

Japanese Patent Application Unexamined Publication Disclosure No. 2003-258021 proposes a structure of a wire bonding apparatus configured such that, a driving motor is provided at one end of a supporting frame rotatable about a rotating shaft, and rotating the supporting frame by the driving motor causes the tip end of the ultrasonic horn that is attached to the other end of the supporting frame to be driven in the Z direction, which is an upward-downward direction.

In addition, because a workpiece such as the circuit board or the semiconductor die is required to be heated when bonding depending on the type of the workpiece, a bonding stage on which a circuit board is fixed by vacuum suction is provided with a heating unit such as an electrical heater. Accordingly, the radiated heat generated from the circuit board that has been heated by the heater when bonding is transmitted to the ultrasonic horn, resulting in an increase of the temperature of the ultrasonic horn (for example, see Japanese Patent Application Unexamined Publication Disclosure Nos. 2000-332050 and 2000-164624). Because the capillary is attached to a tip end portion of the horn that is cantilevered, a varying temperature of the ultrasonic horn causes positional variation of the capillary.

In view of the above problem, Japanese Patent Application Unexamined Publication Disclosure No. 2000-332050 proposes providing a shielding plate and an air cooling nozzle in order to avoid the heat radiated from a heater of a bonding stage. Further, Japanese Patent Application Unexamined Publication Disclosure No. 2000-164624 proposes a method of cooling an ultrasonic horn by providing a path for coolant air to cool the ultrasonic horn.

According to the wire bonding apparatus disclosed by any of Japanese Patent Application Unexamined Publication Disclosure Nos. H05-82577 and 2003-258021, the tip end of the capillary must be vertical to the workpiece in a state in which the capillary attached to the tip end of the ultrasonic horn is brought into contact with the workpiece. Consequently, a rotational center of the ultrasonic horn or the supporting frame is required to be as high as the tip end of the capillary in the contact state. Thus, the size of the circuit board that can be bonded is limited by the length of the ultrasonic horn.

Despite such a limitation, the recent trend of increasing in size of the circuit board demands the capability of bonding to a larger workpiece. However, the ultrasonic horn is formed by a metal so as to exhibit a predetermined standing wave and a predetermined exciting force, because the ultrasonic horn is formed as an arm from the rotational center, and at the same time, serves to pressure bond the wire by exciting the capillary at the tip end using the ultrasonic transducer attached to the horn. Accordingly, increasing the length of the ultrasonic horn in order to adopt the bonding to a larger workpiece adversely increases the weight of the horn and a moment of inertia of rotation of the ultrasonic horn about the rotational center, resulting in a problem that it is difficult to drive at a high speed.

Further, according to the method of cooling the ultrasonic horn by air as disclosed in Japanese Patent Application Unexamined Publication Disclosure No. 2000-332050 or 2000-164624, a temperature variation of about two to three degrees Celsius can be caused in the ultrasonic horn depending on how the coolant air is blown onto the ultrasonic horn. Accordingly, it is difficult to prevent deterioration in the bonding quality due to the positional displacement of the ultrasonic horn.

Moreover, the ultrasonic horn is formed by a metal having high thermal expansion. Accordingly, increasing the length of the ultrasonic horn to adopt a larger circuit board also adversely increases the positional variation due to the varying temperature, resulting in a problem that the bonding accuracy decreases.

SUMMARY OF THE INVENTION

An object of the present invention is to provide bonding to a large sized workpiece at a high speed and with high accuracy.

A horn attachment arm according to the present invention, in which a driving unit is fixed to one end of the arm and an ultrasonic horn is attached to the other end of the arm, includes: a fixing bracket provided on a side of the one end; an ultrasonic horn attaching bracket provided on a side of the other end; and an arm member constituted of a fiber reinforced plastic having greater intensity in a longitudinal direction than in a width direction and connecting the fixing bracket and the ultrasonic horn attaching bracket.

In the present invention, it is preferable that the horn attachment arm according to the present invention be such that the arm member includes two flat plates for sandwiching the fixing bracket and the ultrasonic horn attaching bracket; and a flat plate space keeping member fixed between the flat plates to keep a distance between the flat plates.

It is also preferable that the horn attachment arm according to the present invention be such that the flat plate space keeping member is a longitudinal structure member that includes flanges fixed to the flat plates respectively, and a web connecting the flanges, the flat plate space keeping member extending between the fixing bracket on the side of the one end and the ultrasonic horn attaching bracket on the side of the other end. It is also preferable that the flat plate space keeping member be a spacer fixed between the fixing bracket on the side of the one end and the ultrasonic horn attaching bracket on the side of the other end. It is also preferable that the spacer be a honeycomb structure member made of plastic and metal foil.

It is also preferable that the horn attachment arm according to the present invention be such that the fiber reinforced plastic is one of a carbon fiber reinforced plastic or a glass fiber reinforced plastic, and/or that the fiber reinforced plastic has a greater number of reinforced fibers in a longitudinal direction than in a width direction.

The present invention is effective in providing bonding to a large sized workpiece at a high speed and with high accuracy.

DETAILED DESCRIPTION OF THE INVENTION

Hereinafter, preferred embodiments of the present invention will be concretely described with reference to the accompanying drawings.

Figure 1:
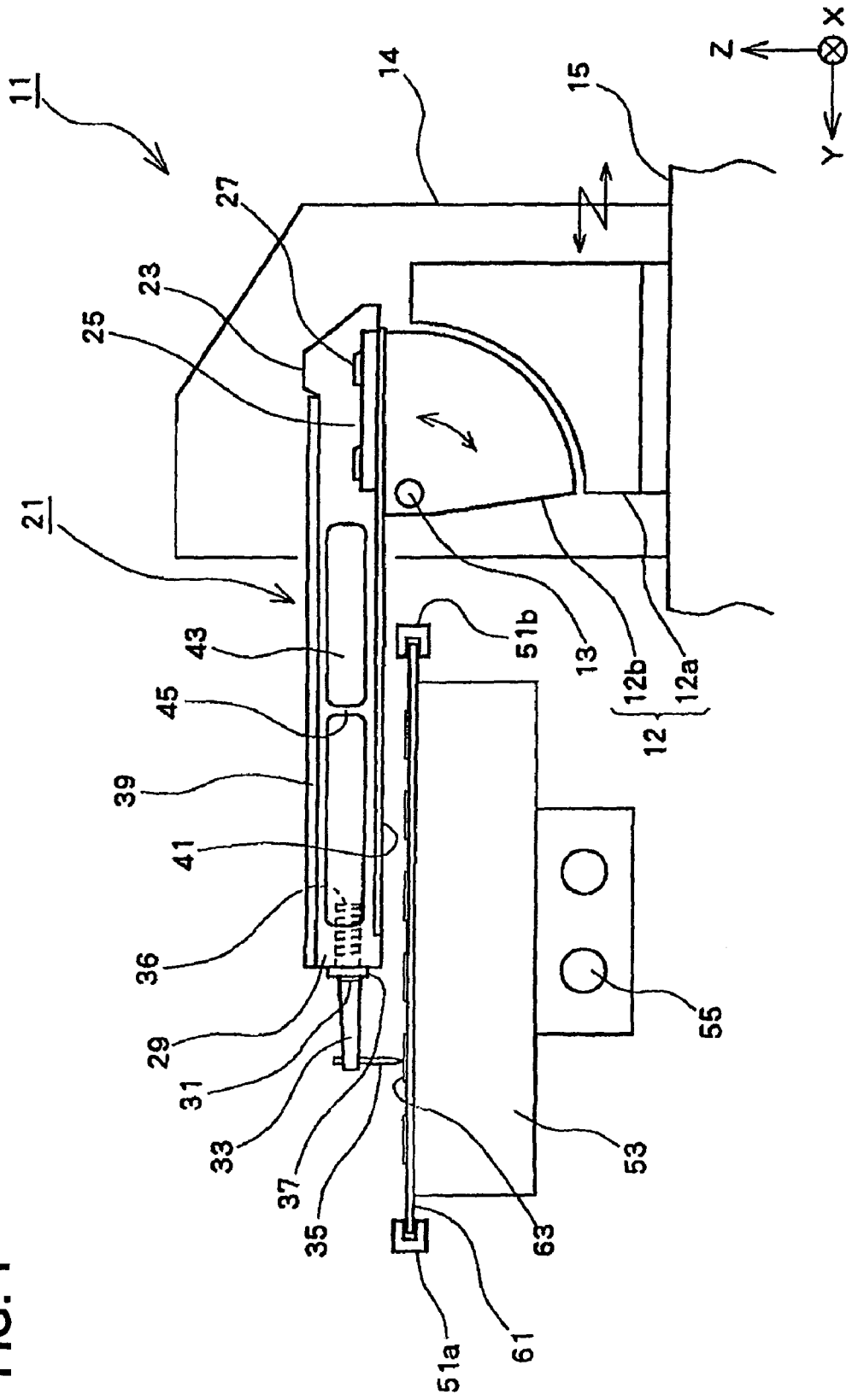
FIG. 1 is an illustrative diagram showing a structure of a wire bonding apparatus provided with a horn attachment arm in accordance with an embodiment of the present invention.

As shown in FIG. 1, a wire bonding apparatus 11 is provided with a Z-direction driving motor 12 having a stator 12a and a moveable member 12b in a bonding head 14 that is mounted on an XY table 15 and freely movable in an XY direction. The stator 12a is fixed to the bonding head 14, and the moveable member 12b is rotatably attached to a rotating shaft 13 attached to the bonding head. A horn attachment arm 21 is fixed to an upper surface of the moveable member 12b as a driving unit using a bolt 27, and an attaching flange 37 of an ultrasonic horn 33 is fixed to a tip end of the horn attachment arm 21 using a bolt 31. A capillary 35 is attached to a tip end of the ultrasonic horn 33.

A frame of the wire bonding apparatus 11 that is not shown in the drawings is provided with rails 51a and 51b for guiding a circuit board 61 to which a semiconductor die 63 is mounted, a bonding stage 53 for vacuum suctioning the circuit board, and a heater 55 for heating a bonding stage 53.

The wire bonding apparatus 11 bonds between an electrode of the semiconductor die 63 and an electrode of the circuit board 61 with a wire threaded through the capillary 35 by driving the XY table 15 to position the capillary 35 at a position of the electrode of the semiconductor die 63, and then rotating the moveable member 12b of the Z motor to move the capillary 35 attached to the tip end of the ultrasonic horn 33 in a Z direction. Further, when bonding, the circuit board 61 that is vacuum suctioned to the bonding stage 53 is heated by the heater 55 provided below the bonding stage.

When completing the bonding between a single electrode of the semiconductor die 63 and an electrode of the circuit board 61, the wire bonding apparatus 11 moves the capillary 35 using the XY table 15 above a succeeding electrode, and bonds between two electrodes in the same manner as described above. Then, when bonding all of the electrodes of a single semiconductor die 63 to the corresponding electrodes of the circuit board 61 using the wire, the bonding head 14 is moved by the XY table 15, and the capillary 35 is positioned at the position of electrodes of a succeeding semiconductor die 63 to perform the wire bonding.

The horn attachment arm 21 extends toward the tip end at which the ultrasonic horn 33 is provided from the moveable member 12b of the driving motor. The length of the horn attachment arm 21 is sufficient so that, even if the circuit board 61 is large-sized and configured by attaching the semiconductor die 63 to a matrix, the capillary 35 can reach each and every electrode of the circuit board 61 to perform the wire bonding.

In this embodiment, the horn attachment arm 21 is constructed to be directly fixed to the moveable member 12b of the driving motor 12. However, as long as the tip end of the ultrasonic horn 33 can be driven upward and downward, the horn attachment arm 21 is not necessarily needed to be directly fixed to the moveable member 12b of the driving motor 12. The horn attachment arm 21 can be fixed to such as a supporting frame that is rotatably driven by the driving motor 12, or can be attached to form a part of a linkage for performing the bonding operation.

Figure 2A:
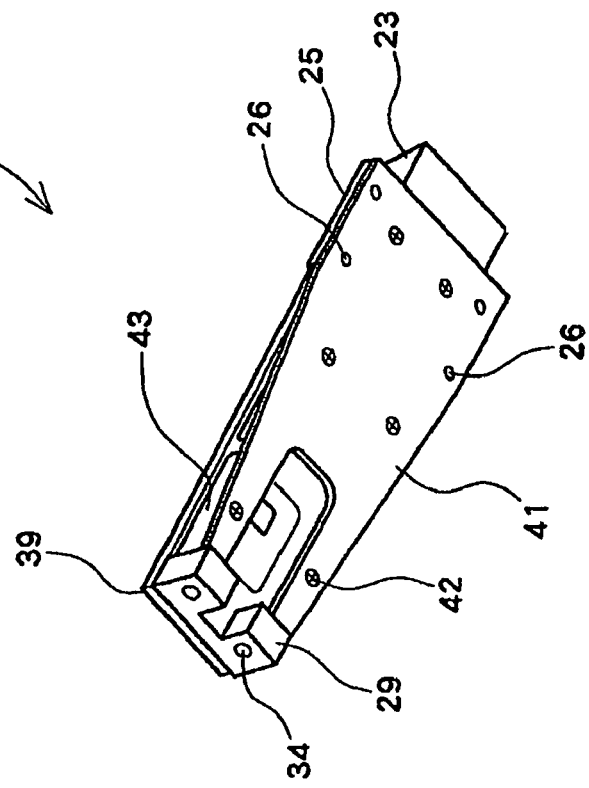
FIGS. 2A and 2B are perspective views of the horn attachment arm in accordance with the embodiment of the present invention.
Figure 2B:
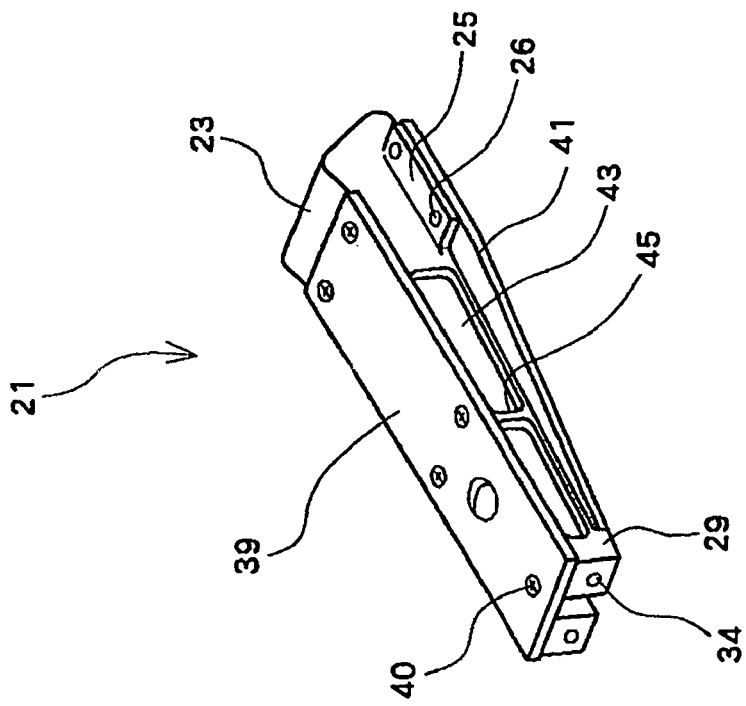

As shown in FIG. 1 and FIGS. 2A and 2B, the horn attachment arm 21 is provided with a fixing bracket 23 having fixation flanges 25 on both sides thereof on the moveable member 12b of the driving motor 12 as a driving unit, and an ultrasonic horn attaching bracket 29 having the attachment hole 34 for attaching the ultrasonic horn 33 on the tip end side. The brackets 23 and 29 that have complex shapes are formed by machine processing from a lightweight alloy such as a magnesium alloy having preferable high workability.

Figure 3:
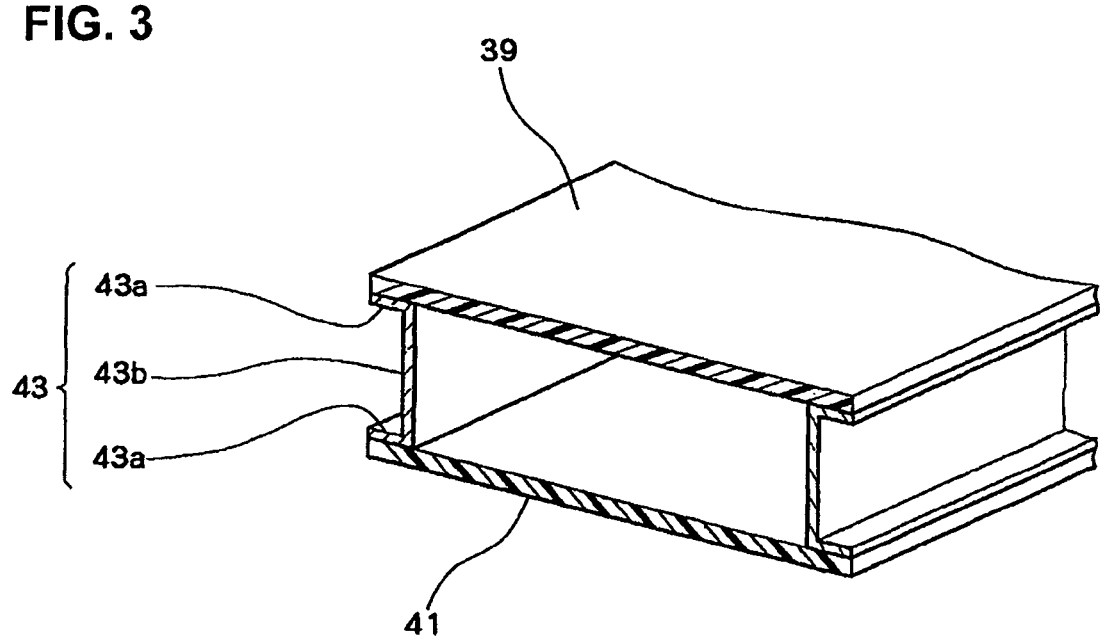
FIG. 3 is a perspective view showing a connection structure between a longitudinal structure member and a flat plate of the horn attachment arm in accordance with the embodiment of the present invention.

Each of the brackets 23 and 29 is fixed by being sandwiched between flat plates 39 and 41 made of carbon fiber reinforced plastic. A longitudinal structure member 43 made of a lightweight alloy such as a magnesium alloy as a flat plate space keeping member is attached between the flat plates 39 and 41 and extends between the brackets 23 and 29. In this embodiment, the longitudinal structure member 43 has flanges 43a on surfaces that face the flat plates as shown in FIG. 3, and a web 43b connecting the flanges 43a is provided between the flanges 43a. Further, a rib 45 for connecting the flanges 43a to ensure the structural rigidity and strength is provided at a center of the longitudinal structure member 43. The brackets 23 and 29 and the flanges 43a of the longitudinal structure member 43 are fixed to the flat plates 39 and 41 using screws 40 and 42 and an adhesive agent. Such a structure can also be adopted in which the fixing bracket 23 made from a lightweight alloy such as a magnesium alloy, the ultrasonic horn attaching bracket 29, the longitudinal structure member 43, and the flat plates 39 and 41 are assembled and fixed by a jib, and then the flat plates 39 and 41 are attached from both sides.

As shown in FIG. 2B, a space in which the ultrasonic transducer 36 of the ultrasonic horn 33 is fitted is provided on a lower side of the horn attachment arm 21.

The carbon fiber reinforced plastic that constitutes the flat plates 39 and 41 fixed to both sides of the horn attachment arm 21 is a resin including reinforced fibers of carbon fibers intertwined and/or aligned in various directions. The carbon fiber reinforced plastic is a material that possess an anisotropic intensity property depending on the direction of the reinforced fibers. In this embodiment, the carbon fiber reinforced plastic that constitutes each of the flat plates 39 and 41 has a greater number of reinforced fibers in a longitudinal direction than in a width direction. Accordingly, the rigidity and strength of the carbon fiber reinforced plastic in the longitudinal direction is several times greater than the rigidity and strength of a lightweight alloy such as a magnesium alloy. Further, because the specific gravity of the carbon fiber reinforced plastic is substantially the same as that of a lightweight alloy such as a magnesium alloy, using the carbon fiber reinforced plastic can realize a more lightweight and highly rigid structure. While a thermal expansion ratio of a lightweight metal such as a lightweight alloy such as a magnesium alloy is on the order of $2 \times 10^{-5}$ to $3 \times 10^{-5}$, the carbon fiber reinforced plastic is a material whose linear thermal expansion coefficient can be substantially zero and therefore is less affected by the thermal variations.

When bonding by the wire bonding apparatus 11 structured using the horn attachment arm 21 configured as above, the circuit board 61 on the bonding stage 53 is heated by the heater 55, and the radiated heat in turn heats the flat plate 41 provided on a side of the bonding stage of the horn attachment arm 21. However, because the thermal expansion coefficient of the carbon fiber plastic is substantially zero, the amount of the thermal expansion of the carbon fiber plastic is also substantially zero. Further, the amount of the thermal expansion of the flat plate 39 provided on an upper surface of the horn attachment arm 21 is also substantially zero. Moreover, while the fixing bracket 23 constituted from a lightweight alloy such as a magnesium alloy, the ultrasonic horn attaching bracket 29, and the longitudinal structure member 43 connected to the brackets 23 and 29 attempt to thermally expand by being heated by the radiated heat from the circuit board 61 of the bonding stage 53, they are also fixed by being sandwiched between the flat plates 39 and 41 of the carbon fiber reinforced plastic having greater rigidity than that of the lightweight alloy by several times from the upside and downside. Therefore, the thermal expansion of the brackets 23 and 29 made of the lightweight alloy such as a magnesium alloy and the longitudinal structure member 43 becomes an internal stress of each member, which is suppressed by the flat plates 39 and 41 made of the carbon fiber reinforced plastic. As a result, the amount of the thermal expansion in the longitudinal direction from the ultrasonic horn attaching bracket 29 of the horn attachment arm 21 to the fixing bracket 23, and the horn attachment arm 21 exhibits an advantageous effect that a positional displacement is not varied by the thermal expansion due to the radiated heat from the circuit board 61 on the bonding stage 53.

Although the ultrasonic horn 33 attached to the tip end of the horn attachment arm 21 is affected by the radiated heat of the bonding stage, the amount of the thermal expansion caused by the radiated heat is small because the length of the horn is shorter than the horn attachment arm 21, and therefore the amount of positional displacement can be corrected by a positional correction control system. Accordingly, the ultrasonic horn 33 and the horn attachment arm 21 can integrally be a structure that is less affected by the radiated heat, and an advantageous effect that a decrease in bonding accuracy due to the positional displacement can be suppressed is exhibited.

When bonding, the horn attachment arm 21 and the ultrasonic horn 33 attached to the tip end integrally rotate reciprocatorily about the rotating shaft 13 by the Z driving motor 12, and the capillary attached to the tip end of the ultrasonic horn 33 is reciprocatingly moved in a direction of moving close to and away from the workpiece. Specifically, the horn attachment arm 21 and the ultrasonic horn 33 attached to the tip end integrally move reciprocatingly in a up and down direction in FIG. 1, and receive a bending moment in the up and down direction by an moment of inertia about the rotating shaft 13 during the reciprocating movement. The horn attachment arm 21 according to this embodiment is configured such that the flat plates 39 and 41 made of the carbon fiber reinforced plastic are attached to the upper and lower surfaces where a tensile stress and a compressive stress in the longitudinal direction due to the bending moment are maximum, and the longitudinal structure member 43 provided between the flat plates 39 and 41 maintains the distance there between so that flat plates 39 and 41 can counter the bending moment with the tensile strength and the compressive strength. Accordingly, the horn attachment arm 21 is notably high in strength and rigidity against the bending moment. In particular, in this embodiment, the strength and rigidity of the flat plates 39 and 41 in the longitudinal direction is greater than that of the lightweight alloy such as a magnesium alloy by several times, and accordingly, providing the shape is the same, it is possible to maintain strength and rigidity against the bending moment caused by the bonding operation that is higher by several times. Further, it is possible to adjust the structure to be lighter in weight and higher in strength and rigidity than the structure configured from the lightweight alloy such as a magnesium alloy. For example, when the thickness is half as thick as the thickness in the case in which the lightweight alloy such as a magnesium alloy is used, it is possible to make the bending strength and rigidity substantially three times as large as in the case in which the lightweight alloy such as a magnesium alloy is used, and the weight smaller than the case in which the lightweight alloy such as a magnesium alloy is used. Because the horn attachment arm 21 according to this embodiment can form a lightweight rotational movement system while maintaining its strength and rigidity, it is possible to provide an advantageous effect that the moment of inertia of the rotational system is smaller and a high speed driving becomes possible.

Furthermore, because the distance from the rotating shaft 13 to the tip end of the capillary 35 can be increased by the lightweight horn attachment arm 21 having high strength and rigidity with reduced length of the ultrasonic horn 33 attached to the tip end of the horn attachment arm 21, it is possible to provide the advantageous effects that the bonding to the large sized circuit board 61 becomes possible, that the weight of the ultrasonic horn 33 and the horn attachment arm 21 as a whole is reduced, and that the moment of inertia of the rotational system is smaller and high speed driving becomes possible.

As described above, when bonding, the horn attachment arm 21 moves reciprocatingly upward and downward. With this movement, the horn attachment arm 21 is vibrated. The vibration that is generated mainly includes bending vibration in the up and down direction of the movement, lateral vibration in a right and left direction of the movement, and torsional vibration. This embodiment has an advantageous effect that these vibrations can be reduced by increasing the rigidity using the flat plates 39 and 41 made of the carbon fiber reinforced plastic. This embodiment has a further advantageous effect that it is possible to suppress the decrease in bonding accuracy due to effects such as resonance, because it is possible to provide a horn attachment arm 21 having stable operation in which the vibration attenuation rate of the entire horn attachment arm 21 is large and less resonance is caused because the carbon fiber reinforced plastic having a high vibration attenuation rate as a main material of a member is used to increase the strength and rigidity.

In this embodiment, because the horn attachment arm 21 is constituted using the flat plates 39 and 41 made of carbon fiber reinforced plastic, it is possible to configure the horn attachment arm 21 using a simple method of cutting and attaching a flat plate made without using a mold. Therefore, this embodiment provides an effective method of production of the horn attachment arm 21. Further, portions that cannot be easily formed by the carbon fiber reinforced plastic, such as an attachment portion of the ultrasonic horn 33, a portion for attachment to the driving motor, and an attachment portion of an encoder, can be formed from the lightweight alloy material such as a magnesium alloy that can be easily processed. Therefore, this embodiment provides an advantageous effect that a horn attachment arm 21 is provided with required processing accuracy and the properties of lightweight and high rigidity.

As described above, this embodiment has an additional advantageous effect of providing bonding to a large sized workpiece at a high speed and with high accuracy using a simple structure.

While this embodiment is described taking an example in which the flat plates 39 and 41 is constituted from carbon fiber reinforced plastic, the reinforced fibers are not limited to carbon fibers as long as the reinforced fibers are the fiber reinforced plastic, and can be other types of reinforced fibers such as glass fibers.

Other embodiments are described with reference to FIG. 4A to FIG. 6. The like components described in the previous embodiment with reference to FIG. 1 to FIG. 3 are indicated by the like numerals and an explanation for these components is omitted.

Figure 4A:
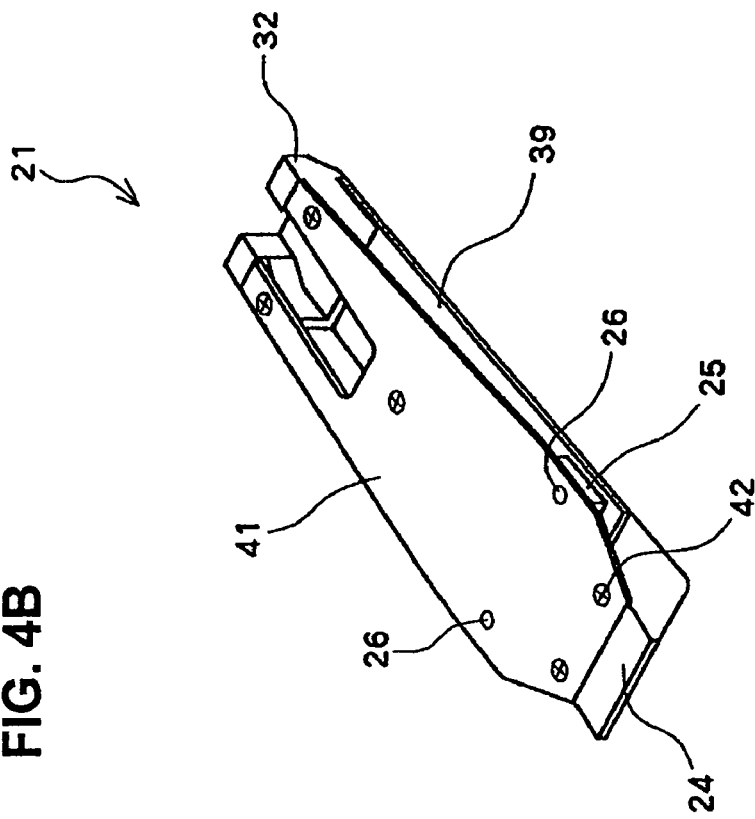
FIGS. 4A and 4B are perspective views of the horn attachment arm in accordance with a different embodiment of the present invention.
Figure 4B:
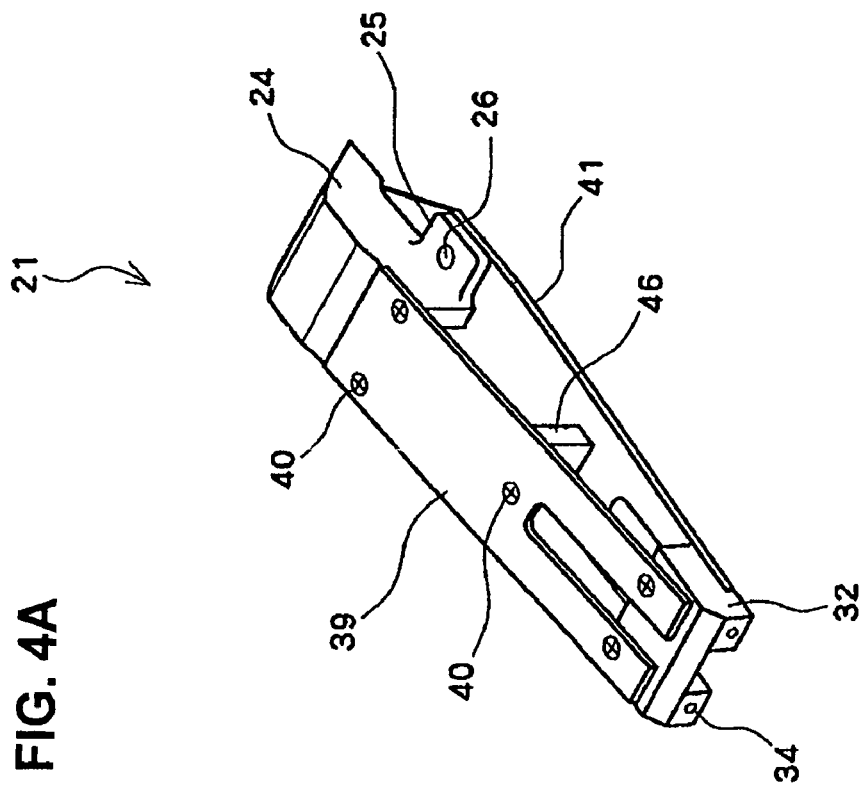

As shown in FIG. 4A, in this embodiment, a fixing bracket 24, an ultrasonic horn attaching bracket 32, the flat plates 39 and 41, and a spacer 46 are provided. The fixation flange 25 having a fixation hole 26 is provided on a side of the fixing bracket 24. The fixing bracket 24 is made of a lightweight metal material having high workability such as a magnesium alloy to have high accuracy. The ultrasonic horn attaching bracket 32 has a surface for attaching the ultrasonic horn to the tip end and the ultrasonic horn attachment hole 34 provided on this surface, and has a cutout in which the ultrasonic transducer 36 is fitted in on a lower surface as shown in FIG. 4B. The ultrasonic horn attaching bracket 32 is made of a lightweight metal material having high workability such as a magnesium alloy to have high accuracy. The fixing bracket 24 and the ultrasonic horn attaching bracket 32 are independent blocks, an upper and a lower surfaces of the brackets 24 and 32 are sandwiched by the flat plates 39 and 41 made of the carbon fiber reinforced plastic and fixed by screws 40 and 42 and an adhesive agent to be integrated structure, and thus the horn attachment arm 21 is formed.

Figure 5:
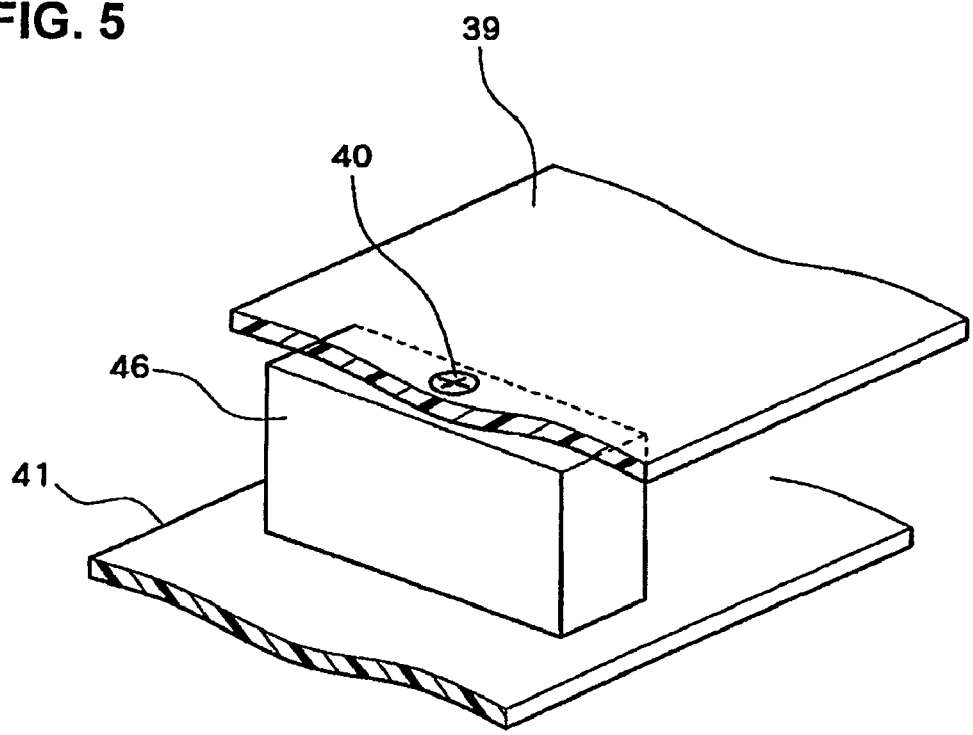
FIG. 5 is a perspective view showing a connection structure between a spacer and a flat plate of the horn attachment arm in accordance with the different embodiment of the present invention.

As shown in FIG. 5, the spacer 46 fixed between the flat plates 39 and 41 is made of the lightweight alloy such as a magnesium alloy, and has a sectional shape that is the same as that of the fixing bracket 24 and the ultrasonic horn attachment bracket 32. The spacer 46 is configured to keep the distance between the flat plates 39 and 41 in the brackets 24 and 32. The spacer 46 can be a rectangular block of an lightweight alloy such as a magnesium alloy, or can be in a shape such that upper and lower flanges are connected by a web in the middle similarly to the longitudinal structure member 43 as described above.

Figure 6:
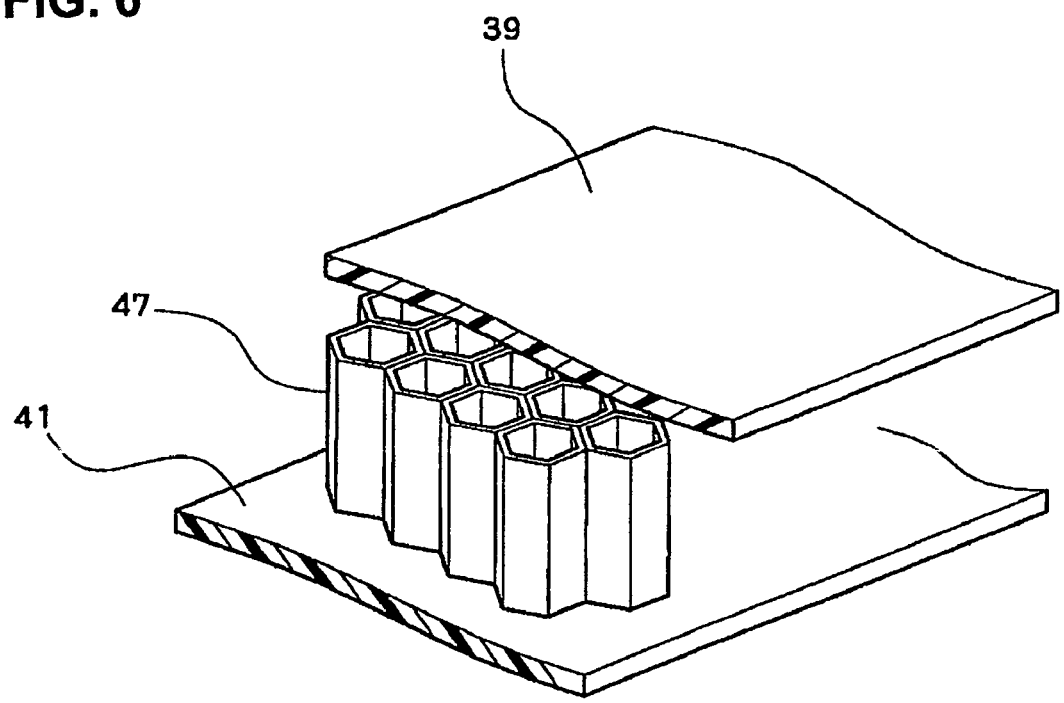
FIG. 6 is a perspective view showing a connection structure between a honeycomb structure member and a flat plate of the horn attachment arm in accordance with the different embodiment of the present invention.

Moreover, when further reduction of the weight is required, as shown in FIG. 6, it is preferable to use a honeycomb structure member 47 as a member to keep the distance between the flat plates. The honeycomb structure member 47 can be made of such materials as a carbon fiber reinforced plastic or an aluminum alloy. When the honeycomb structure member 47 is formed from the carbon fiber reinforced plastic, the flat plates 39 and 41 can be connected using only the adhesive agent without using any screws.

Similarly to the previously described embodiment, this embodiment has an advantageous effect of providing bonding to a large sized workpiece at a high speed and with high accuracy using a simple structure. Further, the horn attachment arm 21 of this embodiment is structured such that the fixing bracket 24, the ultrasonic horn attaching bracket 32, and the spacer 46 or the honeycomb structure member 47 are independently fixed to the flat plates 39 and 41 as arm members. Accordingly, the horn attachment arm 21 of this embodiment has an advantageous effect that, even when the horn attachment arm 21 is heated by the radiated heat from the circuit board 61 on the bonding stage 53, thermal stress is hardly produced between these components and the amount of thermal expansion in the longitudinal direction of the horn attachment arm 21 is substantially zero. Moreover, this embodiment has an advantageous effect that it is possible to-be driven at an increased speed, because further reduction of the weight in comparison with the previously described embodiment can be realized.

Although the above embodiments describe the horn attachment arm 21 of the wire bonding apparatus 11, the horn attachment arm 21 according to the present invention is not limited to application to only the wire bonding apparatus 11, and can be applied to other apparatuses such as a die bonding apparatus.

What is claimed is:

1. A horn attachment arm for a bonding apparatus, a driving unit being fixed to one end of the arm and an ultrasonic horn being attached to the other end of the arm, the arm comprising:

a fixing bracket provided on a side of the one end;

an ultrasonic horn attaching bracket provided on a side of the other end;

a pair of metal longitudinal structure members being connected and fixed to the fixing bracket and the ultrasonic horn attaching bracket; and an arm member comprising two horizontally extending flat plates stacked one above the other and fixed together, the two horizontally extending flat plates sandwiching together to fix, in a vertical direction, the fixing bracket, the ultrasonic horn attaching bracket and the pair of longitudinal structure members therebetween, wherein each of the horizontally extending flat plates of the arm member are constituted of a carbon fiber reinforced plastic having greater strength and rigidity in a longitudinal direction than in a width direction and connecting the fixing bracket and the ultrasonic horn attaching bracket; and wherein the carbon fiber reinforced plastic of the flat plates have a greater number of reinforced fibers in a longitudinal direction than in a width direction, thereby the rigidity and strength of the carbon fiber reinforced plastic in the longitudinal direction is several times greater than the rigidity and strength of a lightweight alloy such as a magnesium alloy while suppressing a linear expansion coefficient of said arm member to substantially zero.

2. The horn attachment arm according to claim 1, wherein the pair of longitudinal structure members are flat plate space keeping members that are fixed between the flat plates to keep a distance, in a vertical direction, between the flat plates.

3. The horn attachment arm according to claim 2, wherein the pair of longitudinal structure members includes flanges fixed to the flat plates respectively, and a web connecting and fixing the flanges, the flat plate space keeping members extending between the fixing bracket on the one end and the ultrasonic horn attaching bracket on the other end.

4. The horn attachment arm according to claim 2, wherein the pair of longitudinal structure members act as a spacer, in a longitudinal direction of the flat plates, fixed between the fixing bracket on the one end and the ultrasonic horn attaching bracket on the other end.

5. The horn attachment arm according to claim 4, wherein the spacer is a honeycomb structure member.

6. The horn attachment arm according to claim 2, wherein the pair of longitudinal structure members extend between the fixing bracket on the one end and the ultrasonic horn attaching bracket on the other end.

* * * * *